United States Patent [19]

Dashevsky et al.

[11] 3,981,751

[45] Sept. 21, 1976

[54] THERMOELEMENT AND THERMOPILE BASED THEREON

[76] Inventors: Zinovy Moiseevich Dashevsky, ulitsa Marxa-Engelsa, 15, kv. 52; Yakov Alexandrovich Kaller, ulitsa Kominterna, 11/7, kv. 20; Nikolai Vasilievich Kolomoets, ulitsa Kastanaevskaya, 61, kv. 22; Igor Vladimirovich Sgibnev, Frunzensky val, 38, kv. 6, all of Moscow, U.S.S.R.

[22] Filed: Dec. 3, 1974

[21] Appl. No.: 529,234

[30] Foreign Application Priority Data

Dec. 6, 1973 U.S.S.R............................ 1975107

[52] U.S. Cl................................ 136/225; 136/212
[51] Int. Cl.².................... H01V 1/02; H01V 1/04
[58] Field of Search............................ 136/225, 212

[56] References Cited
UNITED STATES PATENTS

| | | | |
|---|---|---|---|
| 2,984,077 | 5/1961 | Gaskill | 136/225 |
| 2,993,340 | 7/1961 | Sheckler | 136/225 |
| 3,554,815 | 1/1971 | Osborn | 136/225 |
| 3,648,470 | 3/1972 | Schultz | 136/203 |
| 3,767,470 | 10/1973 | Hines | 136/225 |

Primary Examiner—Nelson Moskowitz
Attorney, Agent, or Firm—Holman & Stern

[57] ABSTRACT

Disclosure is made of a thermoelement comprising a substrate having films of a semiconductor material of n- and p-types applied onto both sides thereof, which films make up the thermoelement branches. Each branch consists of two semiconductor films of one type of conductivity applied one opposite the other onto opposite sides of the substrate. Between the branches the substrate has a row of through holes and commutation buses which interconnect the branches, said buses being arranged on both sides of said row and electrically connected to each other through said holes. Disclosure is further made of a thermopile band upon the proposed thermoelement, which thermopile has a flexible substrate and is accordian-pleated along the rows of holes.

2 Claims, 3 Drawing Figures

THERMOELEMENT AND THERMOPILE BASED THEREON

BACKGROUND AND SUMMARY OF THE INVENTION

The present invention relates to thermal energy converters and, more specifically, to thermoelements and thermopiles.

There is known a thermoelement comprising a substrate which is a thin plane of an insulating material with films of a semiconductor material arranged on both sides of said substrate at a certain distance therefrom, which films form thermoelectric branches of p- and n-type of conductivity, said branches being successively interconnected by means of commutation buses. In a thermopile based upon this thermoelement the buses extend to the end faces of the thermoelements.

In a thermopile employing thermoelements of the foregoing type, the task of arranging the maximum possible number of thermoelements over the substrate surface is achieved by forming the p- and n-type branches as long and narrow strips of semiconductor films.

In case of a temperature difference, electric current flows in such a thermopile along the thermoelement branches, passing from one branch to another through the commutation buses.

In the thermopile under review the thermoelement branches have a great intrinsic resistance due to their geometrical dimensions, because $$R = \rho \frac{l}{b \cdot h},$$

where
  R is the resistance of a branch,
  ρ is the resistivity of the semiconductor film,
  l is the length of the branch, and
  b and h are the width and thickness of the branch, respectively.

In the present case b<1, and h<<1.

The fact that the width of a thermoelement branch is less than its length also reduces the reliability of the thermoelement, as there may appear cracks and ruptures in the active layer. A failure of one thermoelement results in a breakdown of the entire thermopile, as the thermoelements are interconnected in series. The thermoelement under review is further marked by considerable thermal and electric losses due to an insufficient contact surface between the active material (the film) and the commutation material (the commutation bus). A thermopile employing such thermoelements is marked by a low occupation factor of the substrate due to a great number of gaps between the branches.

It is the main object of the present invention to provide a thermoelement with a reduced intrinsic resistance of its branches.

It is another object of the present invention to provide a highly reliable thermoelement.

It is yet another object of the present invention to provide a thermoelement characterized by small thermal and electric losses for commutation.

Finally, it is an object of the present invention to provide a compact thermopile based upon such a thermoelement.

The main and other objects of the present invention are attained by providing a thermoelement comprising a substrate having semiconductor material films of n- and p-type of conductivity applied onto both sides thereof, which films form branches of said thermoelement interconnected by means of commutation buses. In the present thermoelement each branch consists, in accordance with the invention, of two semiconductor films of one type of conductivity, said films being applied one opposite the other onto the opposite sides of the substrate which has, over the portion thereof between the branches, a row of through holes, the commutation buses being arranged on both sides of said row and being electrically interconnected through said holes.

Such thermoelements are advantageous for producing a compact thermopile. The thermopile employing thermoelements of the above type must comprise a flexible substrate which must be accordian-pleated along the rows of through holes.

In the proposed thermoelement the width of a branch is greater than the length thereof, which substantially reduces the intrinsic resistance of the thermoelement and, consequently, of the thermopile wherein such thermoelements are employed. The foregoing factor also accounts for an increased operational reliability of the thermoelement. In addition, due to the fact that each branch of the thermoelement consists of two parallel films, a failure of one film does not lead to a breakdown of the thermoelement itself.

BRIEF DESCRIPTION OF THE DRAWINGS

Due to a greater contact surface between the active layer (the film) and the commutation buses, the thermoelement of the present invention is marked by considerably lower thermal and electric losses for commutation.

Other objects and advantages of the present invention will become more apparent from the following detailed description of the preferred embodiments thereof to be read in conjunction with the accompanying drawings, wherein.

Figure 1:
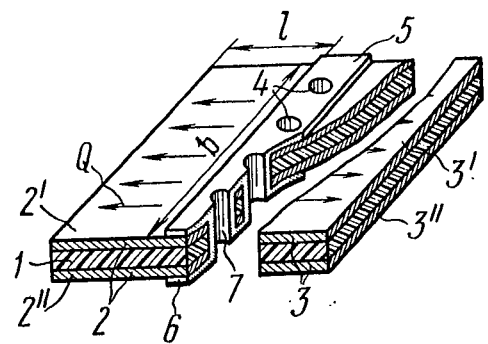
FIG. 1 is an isometric view of a thermoelement in accordance with the present invention.

The thermoelement of FIG. 1 comprises a substrate 1 made as a thin plate of an insulating material with thermoelectric branches 2 and 3 of p- and n-type, respectively, arranged on said plate.

Each branch 2 and 3 consists of two semiconductor films 2', 2'' (p-branch) and 3', 3'' (n-branch) applied one opposite the other onto the opposite sides of the substrate 1. Between the thermoelectric branches 2 and 3 the substrate 1 has a row of through holes 4, which row has metal commutation buses 5 and 6 applied onto it on both sides of the substrate 1. The commutation buses are electrically interconnected via a contact metal layer 7 applied onto the inner surface of the holes 4.

Figure 2:
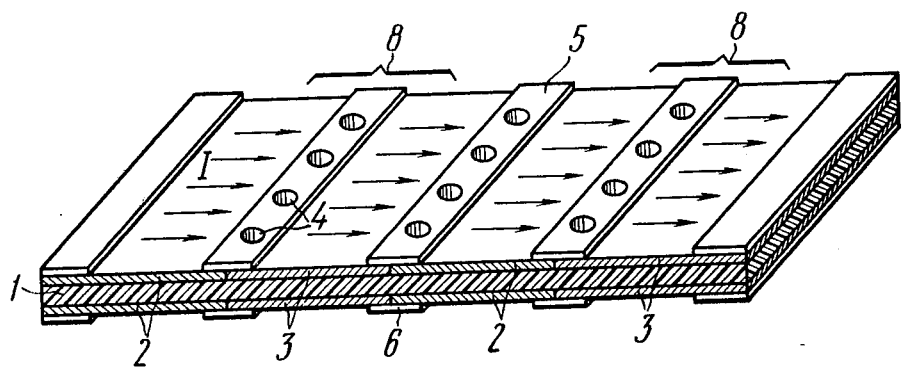
FIG. 2 is an isometric view of a thermopile based on the thermoelement of FIG. 1 in accordance with the invention.

In order to provide a thermopile of FIG. 2, the substrate 1 is constructed so that it may carry a number of thermoelements 8, each of a structure that has been described above (FIG. 1). In such a thermopile all the thermoelements 8 are electrically interconnected by means of the commutation buses 5 and 6 and make up a series circuit.

Figure 3:
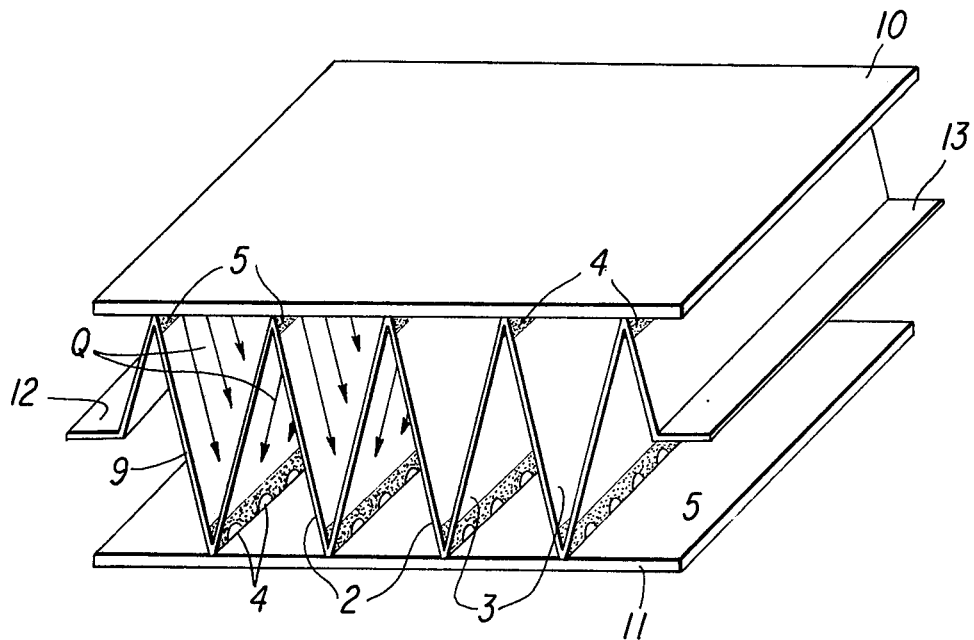
FIG. 3 is a schematic representation of the same thermopile which is accordian-pleated and provided with heat transfer buses.

In a compact version of the same thermopile use is made of the same thermoelements of FIG. 1, but a substrate 9 (FIG. 3) is made of a flexible material and is accordian-pleated in such a manner that adjacent portions of the holes are arranged on opposite sides of the accordian bends along the rows of the holes 4. Heat transfer buses 10 and 11 are connected to the bends of the substrate 9 and engage the bends, the bus 10 being a hot bus, whereas the bus 11 is a cold bus. Voltage is taken off leads 12 and 13.

The proposed thermoelement and the thermopile based on this thermoelement operate as follows:

A temperature difference between the cold and hot buses 10 and 11 (FIG. 3) results in a heat flux $Q \rightarrow Q$ between the adjoining commutation buses 5 and 6 (FIGS. 1 and 2), which, in turn, leads to the appearance of a thermoelectromotive force at the p- and n-branches 2 and 3 of each thermoelement 8 in the thermopile, the total electromotive force of this thermopile beings:

$$E = (\alpha_p + |\alpha_n|).m.$$

where
- $\alpha_p$ is the thermoelectromotive force coefficient of the p-branch;
- $\alpha_n$ is the thermoelectromotive force coefficient of the n-branch; and
- $m$ is the number of thermoelements in the thermopile.

As the thermopile is switched into the circuit, there appears electric current I. The intrinsic resistance of the thermopile is:

$$R = \left( \frac{\rho_p \cdot l}{b \cdot h} + \frac{\rho_n \cdot l}{b \cdot h} \right) \frac{m}{2}.$$

where
- $\rho_p$ is the resistivity of the semiconductor p-type film;
- $\rho_n$ is the resistivity of the semiconductor n-type film; and
- $h$ is the thickness of the semiconductor film.

A two-fold decrease in the resistivity is due to the fact that each branch of the thermoelement consists of two identical films connected in parallel. The foregoing formula does not take into account contact resistances which are small enough in this case due to a substantial contact surface between the active and commutation layers.

What is claimed is:

1. A thermoelement comprising: a substrate; an n-type branch formed by two semiconductor n-type films applied one opposite the other onto the opposite side of one portion of said substrate; a p-type branch formed by two semiconductor p-type films applied one opposite the other onto the opposite sides of another portion of said substrate; a row of through holes provided in said substrate between said n- and p-type branches; commutation buses for interconnecting said branches, there being one bus on both sides of said row of holes, said buses being electrically interconnected through said holes.

2. A thermopile comprising: a flexible substrate; a plurality of n-type branches, each of said n-type branches being formed by two semiconductor n-type films applied one opposite the other onto the opposite sides of said substrate; a plurality of p-type branches, each of said p-type branches being formed by two semiconductor p-type films applied one opposite the other onto the opposite sides of said substrate, in between said n-type branches; a plurality of rows of through holes in said substrate, each row being arranged between adjoining n- and p-type branches; a plurality of commutation buses for connecting said branches to each other, there being one bus on each side of each of said rows of through holes, said buses being electrically connected to each other through said holes; said flexible substrate being accordian-pleated along said rows of through holes in such a manner that adjacent portions of the holes are arranged on opposite sides of the accordian bends.

* * * * *